United States Patent [19]

Pace et al.

[11] Patent Number: 5,604,926
[45] Date of Patent: Feb. 18, 1997

[54] PHASE LOCKED LOOP CIRCUIT CURRENT MODE FEEDBACK

[75] Inventors: Gary L. Pace; Vance H. Peterson; Edgar H. Callaway, Jr., all of Boca Raton, Fla.

[73] Assignee: Motorola, Inc., Schaumburg, Ill.

[21] Appl. No.: 399,784

[22] Filed: Mar. 7, 1995

[51] Int. Cl.$^6$ ........................................ H04B 1/30
[52] U.S. Cl. ..................... 455/260; 455/255; 455/259; 455/264; 331/17
[58] Field of Search .................. 455/196.1, 255, 455/257, 258, 259, 260, 264, 180.3; 375/373, 376; 329/325, 326, 360; 331/17

[56] References Cited

U.S. PATENT DOCUMENTS

| | | | |
|---|---|---|---|
| 5,144,156 | 9/1992 | Kawasaki | 331/17 |
| 5,166,641 | 11/1992 | Davis et al. | 331/17 |
| 5,334,953 | 8/1994 | Mijuskovic | 331/17 |
| 5,399,995 | 3/1995 | Kardontchik et al. | 331/17 |
| 5,495,512 | 2/1996 | Kovacs et al. | 375/373 |

OTHER PUBLICATIONS

ISSCC95/Session of 6/Digital Design Elements/Paper TA 6.5, 1995 IEEE International Solid State Circuits Conference.

*Primary Examiner*—Edward F. Urban
*Assistant Examiner*—Gertrude Arthur
*Attorney, Agent, or Firm*—D. Andrew Floam

[57] ABSTRACT

A phase locked loop (PLL) circuit for use as a demodulator and other applications. The PLL circuit (200) comprises a phase detector (210), a transconductance amplifier (212) and a current controlled oscillator (ICO) (214). The phase detector has two signal inputs and two outputs, and detects a phase difference between signals at its inputs. A capacitor C1 is connected to the output of phase detector (210) and develops an output voltage signal vo(t). A transconductance amplifier (212) is coupled to the capacitor C1 and converts the output voltage signal vo(t) to an output current signal. The ICO (214) is coupled to the transconductance amplifier (212) and the second output of the phase detector (210) and generates an output signal having a frequency which is proportional to an input current signal. The output signal of the ICO (214) is coupled to the second signal input of the phase detector (212).

13 Claims, 6 Drawing Sheets

PHASE LOCKED LOOP CIRCUIT CURRENT MODE FEEDBACK

RELATED APPLICATIONS

The present application is related to the following commonly assigned application, filed on even date: Zero-IF Receiver with Tracking Second Local Oscillator and Demodulator Phase Locked Loop Oscillator, to Pace et al.

1. Field of the Invention

This invention relates to a phase locked loop circuit for use in a receiver and other applications.

2. Background of the Invention

Phase locked loop (PLL) circuits are widely used in demodulators and frequency synthesizers of communication receivers, such as selective call receivers and other frequency modulation (FM) receivers.

Figure 1:
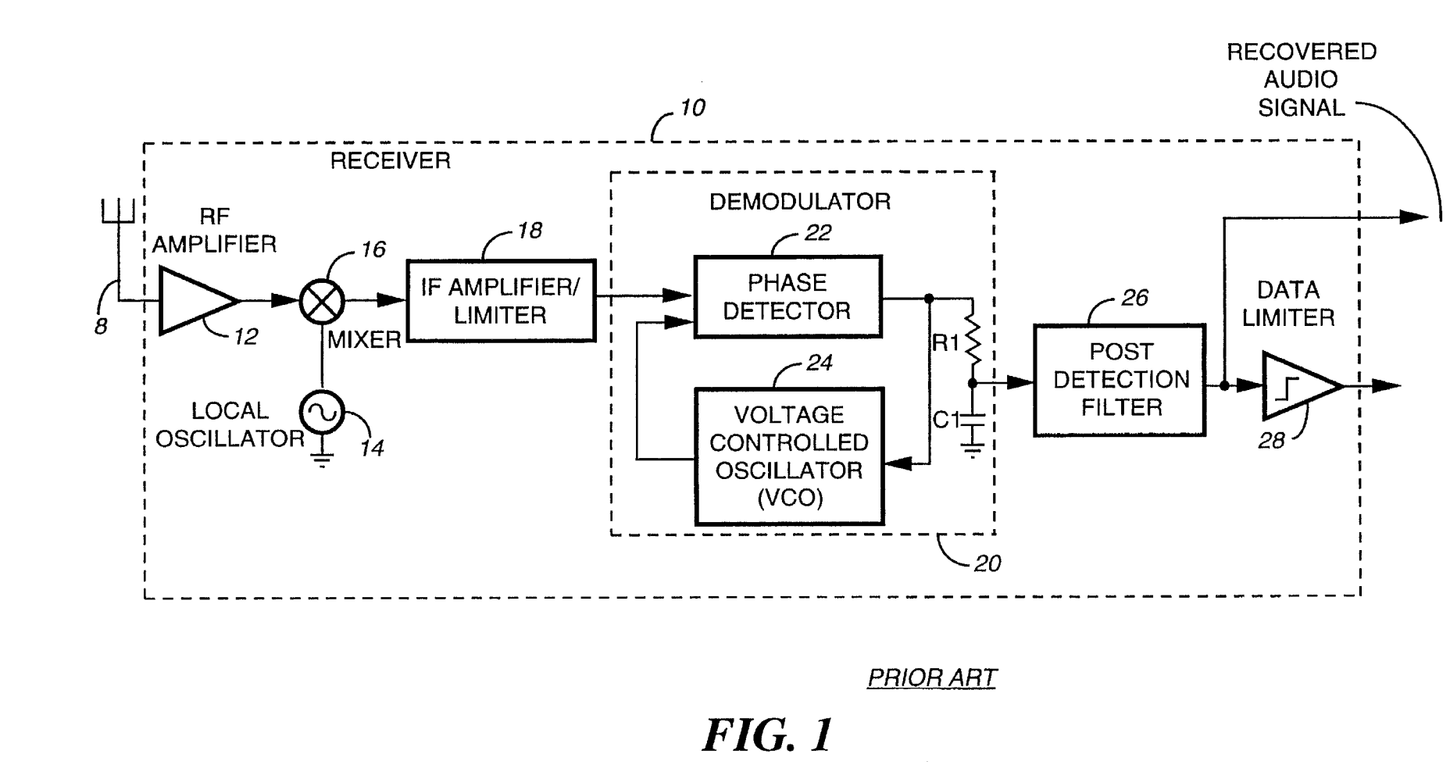
FIG. 1 is an electrical block diagram showing a receiver circuit including a prior art phase locked loop demodulator circuit.

FIG. 1 illustrates a generic conventional receiver circuit 10 which detects a signal at an antenna 8 and generates a demodulated signal. Among other components, the receiver circuit 10 comprises a demodulator 20. The demodulator 20 is a prior art demodulator and comprises a phase detector 22, a voltage controlled oscillator (VCO) 24, and a loop filter including capacitor C1 and resistor R1. The output of the phase detector 22 is applied to the capacitor C1, across which is developed a recovered audio output voltage. The transfer function of the demodulator has a second order low pass characteristic.

In some phase locked loop demodulator applications, a relatively large square wave component rides on the recovered audio wave form which is supplied to the input of the VCO. This limits the minimum operating voltage of the circuit and also makes the implementation of the VCO difficult if it desirable to have low audio distortion. It is highly desirable to eliminate the large square wave component in order to achieve one or more, among others, of the following results:

(1) reduce the minimum operating voltage of the demodulator;

(2) for a given supply voltage, increase the amplitude of the recovered audio signal;

(3) reduce any recovered audio distortion generated by the inability of the VCO to handle the large input signal; and (4) simplify the design of the VCO by reducing its input dynamic range requirements.

Detailed Description of the Drawings

Referring first to FIG. 1, the receiver circuit 10 is a conventional receiver comprising a radio frequency (RF) amplifier 12; a mixing stage comprising a local oscillator 14 and mixer 16 which mixes an output of the amplifier 12 to generate a mixed signal; an intermediate frequency (IF) amplifier/limiter 18, a prior art demodulator 20; a post detection filter (PDF) 26 and a data limiter 28 (if necessary).

Figure 2:
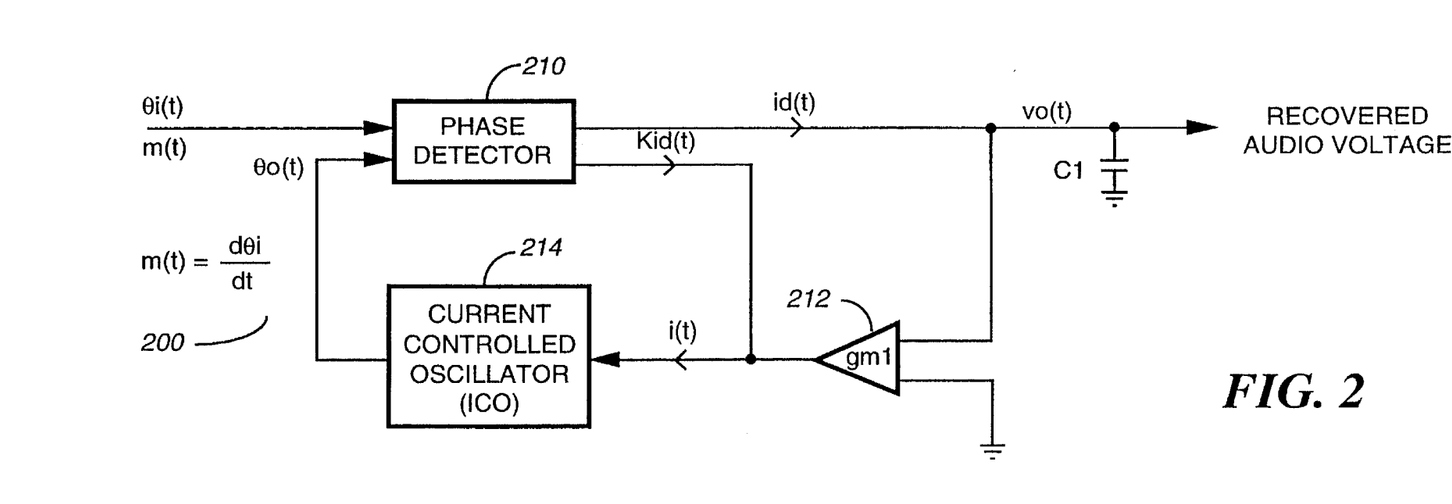
FIG. 2 is an electrical block diagram of a phase locked loop demodulator according to the present invention.

FIG. 2 illustrates a phase locked loop circuit 200 according to the present invention, which is useful in the receiver circuit 10 in substitution for the demodulator 20, and is also useful in other circuits. The phase locked loop circuit 200 comprises a phase detector 210, a transconductance amplifier 212, a capacitor C1 and a current controlled oscillator (ICO) 214.

The phase detector 210 has first and second signal inputs. The first signal input receives the signal to be processed $\theta i(t)$, and the second signal input receives the output signal of ICO 214, $\theta o(t)$. The phase detector 210 detects a phase difference $(\theta i(t)-\theta o(t))$ between signals at the first and second signal inputs to generate as output a first current signal id(t) and a second current signal Kid(t), the second current signal being proportional to the first current signal id(t) by a constant factor K. The first current signal id(t) is proportional to the phase difference between signals at the first and second signal inputs by the factor of Kd, such that
$$id(t)=Kd(\theta i(t)-\theta(t))$$

The capacitor C1 is connected to the first output of the phase detector 210 and receives as input the first current signal id(t) and develops a voltage signal vo(t).

The transconductance amplifier 212, having a gain of gm1, is coupled to the capacitor C1 and receives as input the voltage signal vo(t) and generates an output current signal.

Although amplifier 212 is shown with differential inputs and one input grounded, the grounded input is optionally connected to a bias voltage, or, alternatively, a single input transconductance amplifier is used. The simplest implementation of transconductance amplifier 212 is a resistor with one terminal coupled to capacitor C1 and the other terminal coupled to the input of ICO 214. For a resistor value R1, and assuming that the input resistance of ICO 214 is small in comparison to R1, the equivalent transconductance gm1 is equal to 1/R1.

In some applications, a unity gain amplifier is inserted between capacitor C1 and resistor R1 to provide drive current for resistor R1. One such application is disclosed in the aforementioned co-pending application.

Finally, the input of the ICO 214 is coupled to the transconductance amplifier 212 and the phase detector 210 and receives an input current signal i(t) which is equal to a sum of the phase detector current signal Kid(t) and the output current signal of the transconductance amplifier and generates an output signal $\theta o(t)$ having a frequency which is proportional to the input current signal i(t) by a factor Ko. The output signal of the ICO 214 is coupled to the second signal input of the phase detector 210. The phase detector 210 is different from the phase detector 22 of demodulator 20 (FIG. 1) insofar as it has a second output current signal Kid(t) which is proportional to the first output current id(t) by a proportionality constant K. The inputs to the phase detector 210 are the signal to be processed and the output of the ICO 214, as will be explained in greater detail hereinafter.

The high frequency voltage information that was developed across resistor R1 in the demodulator of FIG. 1 and delivered to the input of the VCO in the form of a duty cycle modulated square wave voltage is now transferred directly from the output of the phase detector to the ICO 214 in the form of a duty cycle modulated square wave current.

In the case in which the phase locked loop circuit 200 is used as a demodulator, the first input of the phase detector 210 is supplied with the frequency modulated signal represented by m(t) and θi(t), where m(t)=dθi(t)/dt, and which is the signal to be processed by the phase locked circuit 200. The first current signal generated by the phase detector 210 is an audio current signal id(t) and the audio current signal is applied to the capacitor C1. The voltage vo(t) developed across the capacitor C1 is the recovered audio voltage signal. The voltage vo(t) is transformed into a current signal by the transconductance amplifier 212 and added to the phase detector current signal Kid(t) to produce a sum current signal i(t). The sum current signal i(t) is applied to the ICO 214 and the output of the ICO 214 is a signal θo(t) whose frequency is proportional to the sum current signal i(t) by an ICO gain factor Ko. The output of the ICO 214 is coupled to the second input of the phase detector 210.

The transfer function of the phase locked loop circuit 200 is:

Vo(s)/M(s)=(Kd/C1)/($s^2$+KoKdKs+KoKdgm1/C1), where the loop natural frequency $\omega n = (KoKdgm1/C1)^{1/2}$;

and the damping factor δ=(K/2)(KoKdC1/gm1)$^{1/2}$, and can be made the same as the phase locked loop circuit of FIG. 1 if the loop parameters are properly selected.

Importantly, the damping factor is controllable independently of the loop natural frequency by adjusting the proportionality constant K between the two current outputs of the phase detector. This proportionality constant can be made programmable on an integrated circuit as will be explained in greater detail hereinafter, and therefore the loop damping factor can be externally controllable in applications where this is desirable. This programmable option is not easily implemented in the prior art demodulator 20 of FIG. 1, where the damping factor is dependent on the fixed resistor R1.

Another advantage of the PLL circuit 200 is that an additional degree of freedom is added for setting the loop gain constants and element values. This flexibility is afforded by the transconductance gain term gm1 which appears in the loop transfer function and expressions for the loop natural frequency and damping factor. This allows the value of capacitor C1 to be lowered as long as the transconductance amplifier gain gm1 is lowered proportionally, without affecting the loop frequency response. As a result, the value of the capacitor C1 can be lowered in many applications to a level such that it can be implemented on an integrated circuit. Therefore, for certain applications, the capacitor C1 can be contained on the same integrated circuit as other components of a receiver or other circuit in which the phase locked loop circuit is used.

In addition, although the loop frequency response does not vary when C1 and gm are changed proportionately, the loop low frequency gain 1/(Kogm) does. Changes in low frequency gain can be prevented by varying Ko and Kd appropriately while keeping the product KoKd constant. This ensures that loop natural frequency and damping factor are not affected since the product term KoKd appears in both of these expressions. This flexibility to adjust the loop gain constants and element values to minimize the loop filter capacitor C1 value while maintaining a given loop transfer function is not afforded by the PLL circuit shown in FIG. 1.

As an example, parameter values for the PLL circuit 200 used as a demodulator in a selective call receiver with a 50 kHz IF frequency are:

Kd=6.11E-7 A/rad

K=1

Ko=6.82E+10 rad/A gm1=2E-5 S

C1=1000pF.

The 1000 pF value of capacitor C1 can be completely integrated in many integrated circuit processes.

Figure 3:
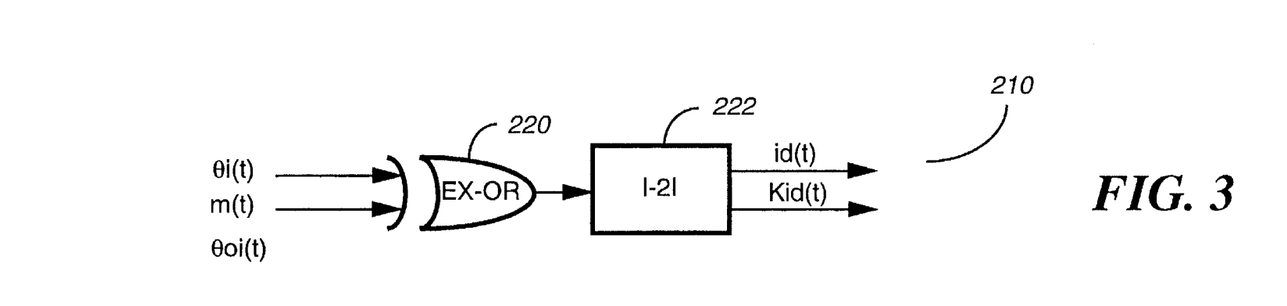
FIG. 3 is art electrical block diagram of a phase detector circuit in the phase locked loop demodulator according to the present invention.

Turning to FIG. 3, the phase detector 210 comprises an exclusive-OR gate 220 and an I-2I voltage-to-current converter 222. The inputs to the exclusive-OR gate 220 are the signal to be processed, such as a frequency modulated signal, and the output of the ICO 214, θo(t). The output of the exclusive-OR gate 220 drives the input of the I-2I voltage-to-current converter 222. I-2I converter 222 generates output current signals id(t) and Kid(t), where Kid(t) is proportional to id(t) by a constant factor K. Fixed currents are sourced from both I-2I converter outputs when the converter input is at a logic level "1", and the same fixed currents are sinked when the input is at a logic level "0".

Figure 4:
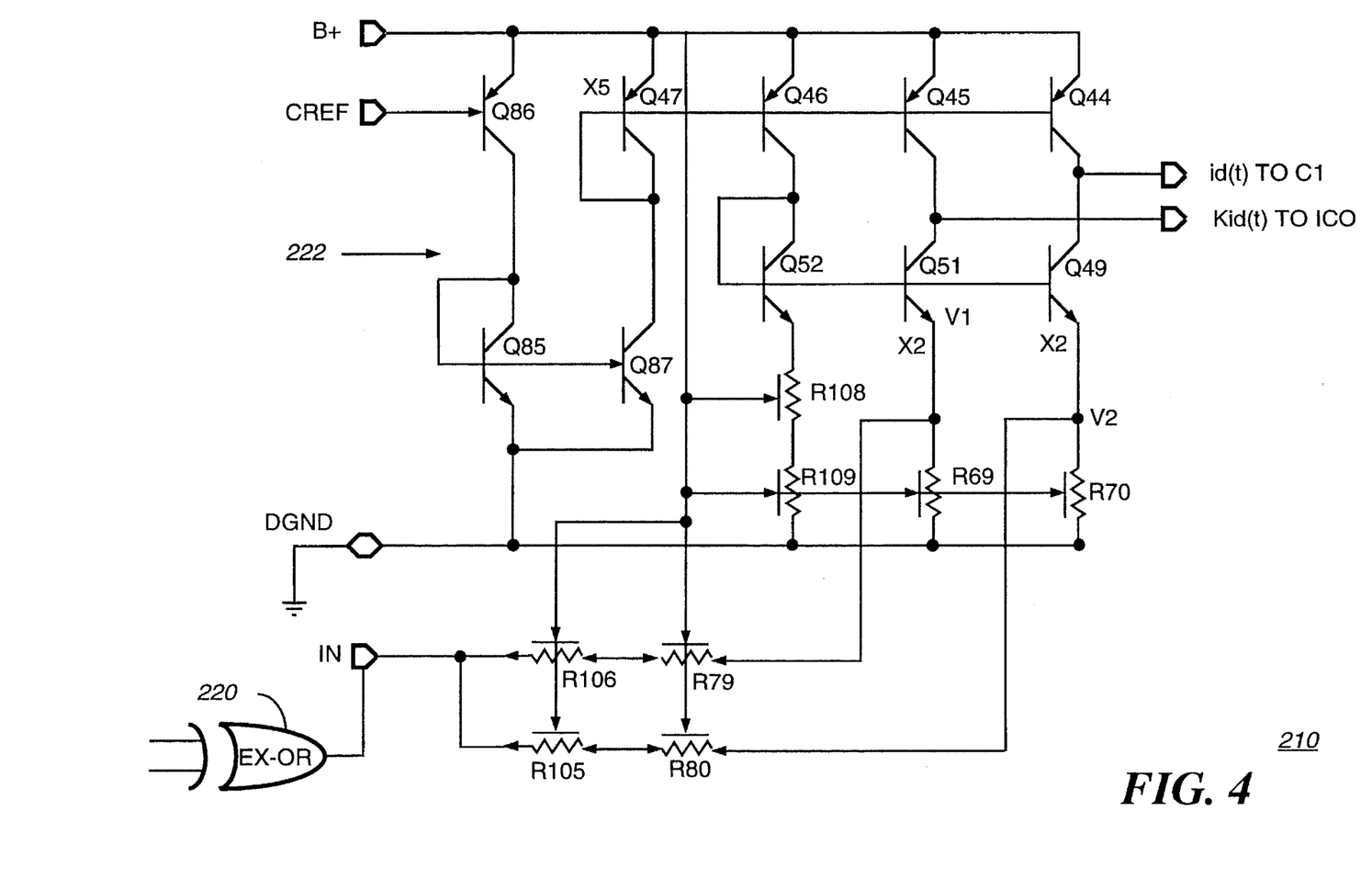
FIG. 4 is an electrical schematic diagram of the phase detector circuit of the phase locked loop demodulator according to the present invention.

FIG. 4 shows the phase detector 210 with the I-2I voltage-to-current converter illustrated in greater detail. Power to the circuit is supplied from voltage source "B+" and is referenced to ground "DGND". The output from exclusive-OR gate 220 is applied to the input "IN". The two current outputs of the circuit are labeled "id(t) to C1" and "Kid(t) to ICO", as are indicated in FIGS. 2 and 3. The base of transistor Q86 ("CREF") is connected to a current reference (not shown) which supplies a current for setting the bias current of the circuit and, consequently, the gain constant of phase detector 210. The collector current from transistor Q86 (typically 5 μA) is applied to current mirror Q85/Q87, mirrored, and then applied to a second current mirror composed of transistors Q44 through Q47. Because the emitter area of diode-connected transistor Q47 is 5 times the emitter area of the other transistors, the current sourced from the collectors of transistors Q44 through Q46 is approximately 1 μA. The collector current from transistor Q46 is applied to a third current mirror composed of transistors Q49, Q51 and Q52. Emitter resistors R69, R70, R108 and R109 are provided to allow the third current mirror to be switched ON and OFF by exclusive-OR gate 220. The emitter area ratios of transistors Q49, Q51 and Q52 and the value of the emitter resistors R69, R70, R108 and R109 are such that the current being sinked by transistors Q49 and Q51 will be twice the current being sourced by transistors Q44 and Q45 or approximately 2 μA.

Resistors R79, R80, R105 and R106 are chosen such that when the input signal to "IN" is high, the voltage on the emitters of transistors Q49 and Q51 is sufficiently high so that transistors Q49 and Q51 will be turned OFF. During this state, the current sourced from the I-2I converter two output nodes is supplied by transistors Q44 and Q45 and is approximately 1 μA. When the input signal to "IN" is low, the current sinked from the I-2I converter two output nodes is the difference between the output current of transistors Q44/Q45 and transistors Q49/Q51 or approximately 1 μA. For the circuit parameters described and for the phase detector two output currents the proportionality constant K is 1. Other values for the proportionality constant K are achievable by adjusting the emitter area ratios of transistors Q44 and Q49 with respect to transistors Q45 and Q51. The values of resistors R69, R70, R79, R80, R105 and R106 are also adjusted appropriately.

The proportionality constant K is optionally made externally programmable by duplicating the I-2I converter 222 with one of the current output circuits eliminated, for example by eliminating transistors Q44 and Q49, and resistors R70, R80 and R105. The proportionality constant K is then programmable by controlling one or both of the bias currents sourced by transistor Q86 in the original and duplicated circuits.

The phase locked loop circuit of the present invention is useful in many types of applications that require a second order phase locked loop circuit, including, but not limited to receivers. FIG. 1 shows an application of the PLL circuit 200 in a simple super heterodyne receiver circuit. The PLL circuit 200 is useful in other receiver circuits, such as, for example, a zero-intermediate frequency (zero-IF) receiver.

Figure 5:
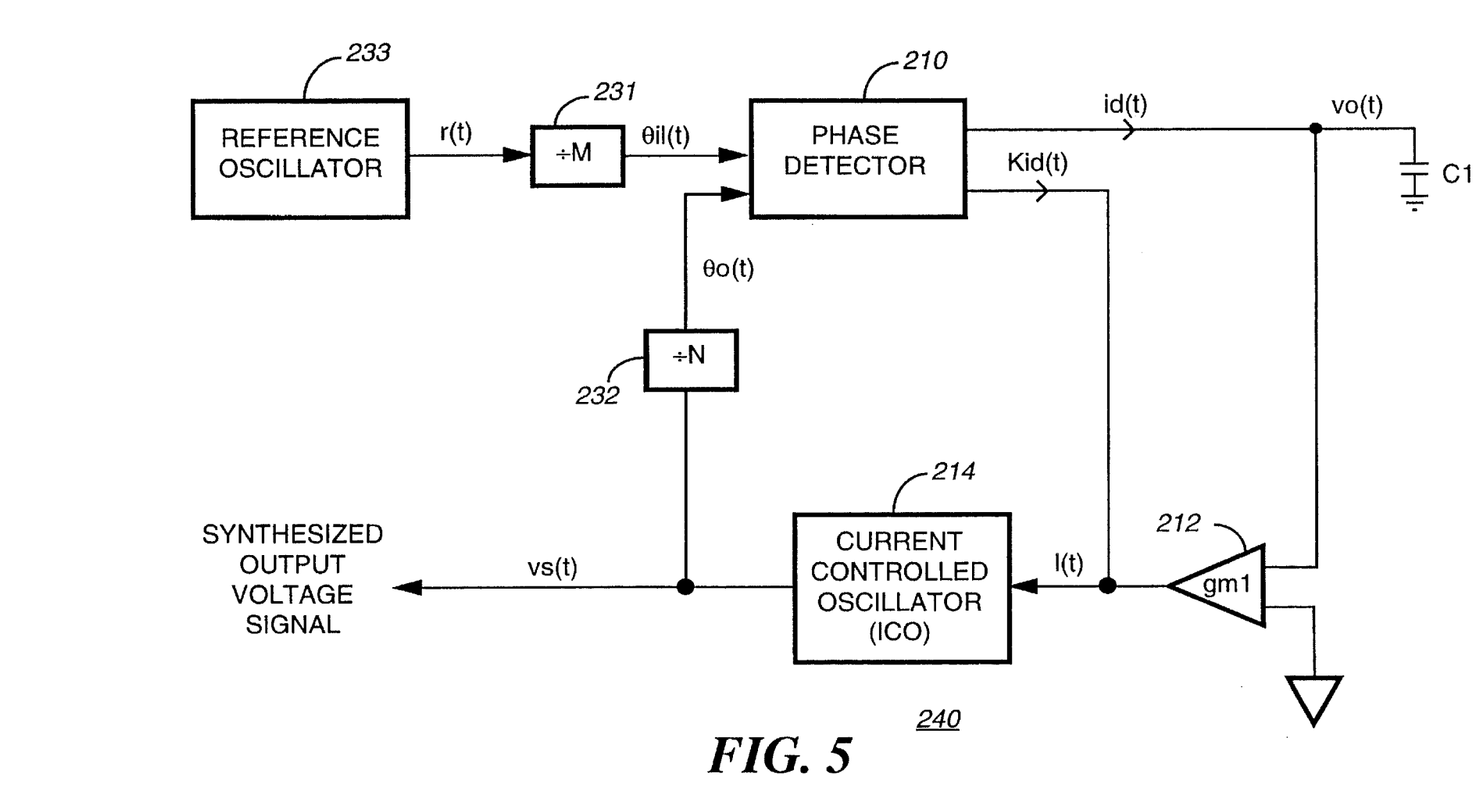
FIG. 5 is an electrical block diagram of a phase locked loop frequency synthesizer according to the present invention.

FIG. 5 illustrates a phase locked loop frequency synthesizer 240 implemented with the PLL circuit according to the present invention. The phase locked loop frequency synthesizer 240 is useful in a receiver circuit similar to the receiver circuit 10 shown in FIG. 1 in substitution for the local oscillator 14, and in other circuits. Phase detector 210, transconductance amplifier 212 and current controlled oscillator 214 perform the same functions as previously described with reference to FIG. 2. Reference oscillator 233 produces a reference oscillator signal r(t) whose frequency is divided by a first magnitude by frequency divider 231, producing a signal θi(t) which is coupled to the first input of the phase detector 210. The synthesized output voltage signal, Vs(t), is generated at the output of the current controlled oscillator 214, and has a frequency which ultimately is the desired synthesized frequency. The frequency of the output of the current controlled oscillator 214 is divided by a second magnitude by the frequency divider 232, producing a signal θo(t), which is connected to the second input of the phase detector 210. Frequency dividers 231 and 232 are programmable and are used to control the frequency in the output voltage signal Vs(t). Changing the first and second magnitudes of the frequency dividers 231 and 232, respectively, controls the frequency of the output (Vs(t)) of the current controlled oscillator. A plurality of frequencies can be generated in the output voltage Vs(t) while employing a single reference oscillator. In some applications, one or both of the frequency dividers 231 and 232 can be eliminated as is well known in the frequency synthesizer art.

The time required for frequency synthesizer 240 to achieve lock is minimized by adaptation of the loop damping factor and natural frequency during the lock acquisition period. Since the damping factor and natural frequency are controllable independently in the PLL circuit of the present invention, this adaptation is easier to implement than in some prior art phase locked loops, where the damping factor is dependent on a fixed resistor.

Figure 6:
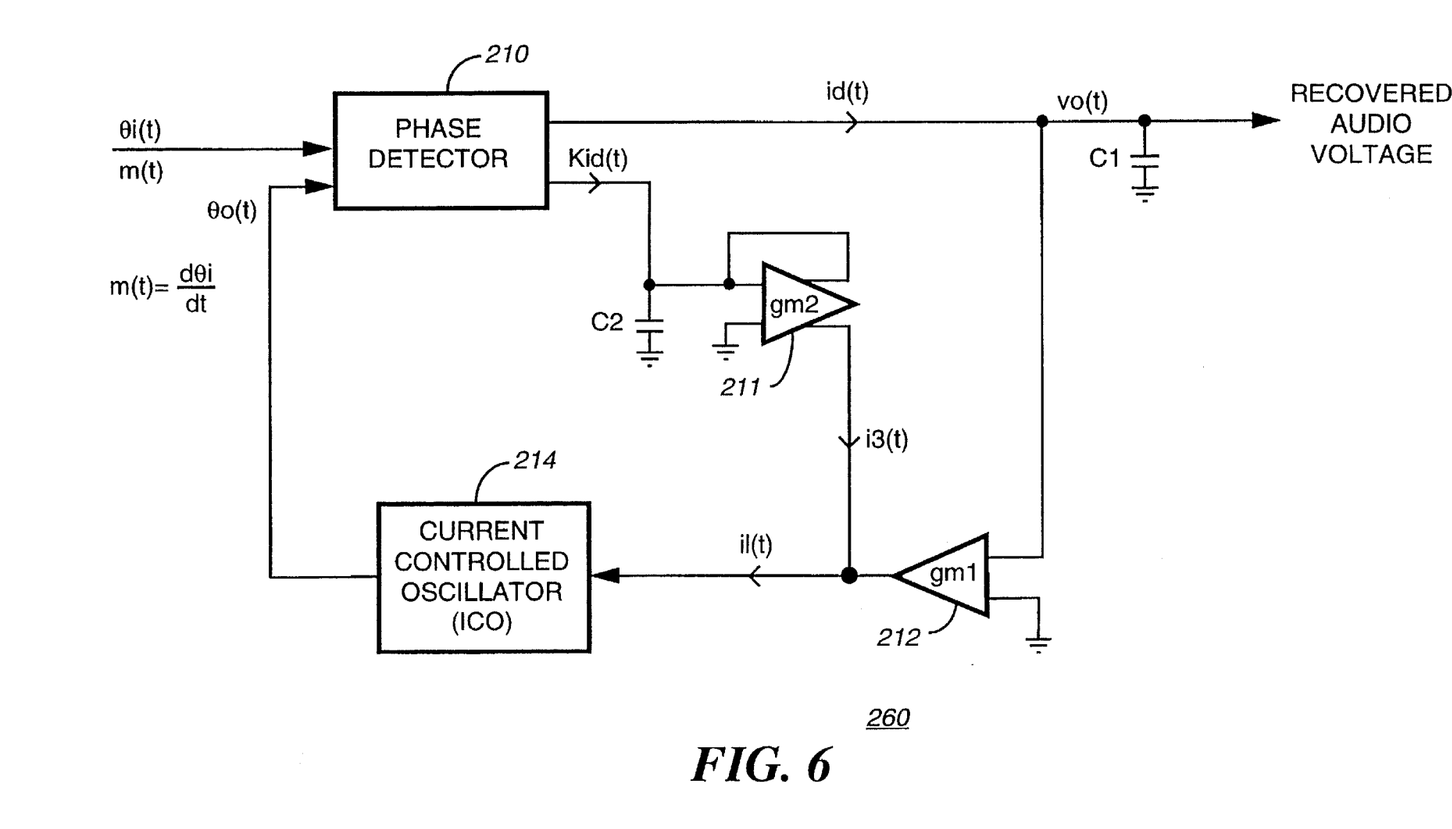
FIG. 6 is an electrical block diagram of a phase locked loop demodulator according to a second embodiment of the present invention.

In applications requiring a third-order phase locked loop, the alternate circuit shown in FIG. 6 is useful. The circuit in FIG. 6 is the same as the circuit in FIG. 2 except that a second capacitor C2 and a second transconductance amplifier 211 with a gain gm2 are inserted in the current path between the second output of phase detector 210 and the input to ICO 214. The transconductance amplifier 211 has differential outputs with one output connected both to capacitor C2 and to its input such that the feedback is negative. The other amplifier 211 output current is summed with the output current of amplifier 212 and applied to the input of ICO 214. Alternatives to the implementation and connection of transconductance amplifier 212, such as the use of a resistor as previously described in reference to FIG. 2, also apply to FIG. 6. The addition of capacitor C2 and transconductance amplifier 211 to the FIG. 2 circuit results in a third order phase locked loop circuit 260 with a transfer function given by:

$$Vo(s)/M(s)=N(s)/D(s)$$

where $$N(s)=(Kd/C1)(s+gm2/C2)$$

and $$D(s)=s^3+(gm2/C2)s^2+(gm1KoKd/C1+C1+gm2KKoKd/C2)s+gm1gm2KoKd/C1C2$$

As shown in the equation, the gain gm2 of transconductance amplifier 211 and the value of capacitor C2 appear only as a ratio gm2/C2. Therefore, setting the ratio of the gain of transconductance amplifier 211 to the value of capacitor C2 is useful to control the third order PLL characteristics. In addition, the value of capacitor C2 can be lowered as long as the transconductance amplifier gain gm2 is lowered proportionately, without affecting the loop characteristics. This provides added flexibility to lower the value of capacitor C2, if necessary, to allow the capacitor to be fabricated on the same integrated circuit as the other components in the circuit.

Other advantages and flexibility of setting the loop characteristics in the third order PLL circuit 260 are similar to those previously described for the second order PLL circuit in FIG. 2. The third order PLL circuit in FIG. 6 is suitable for use in the same applications as previously described for the FIG. 2 circuit, as well as other applications.

Figure 7:
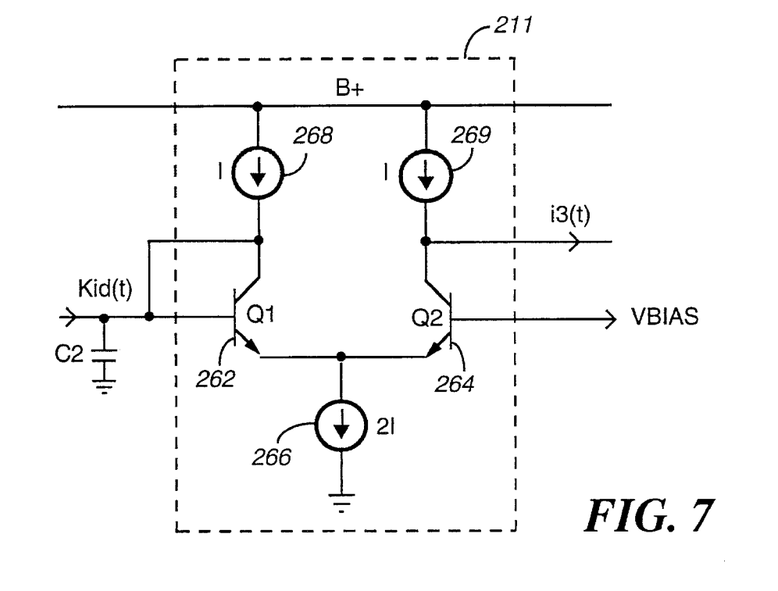
FIG. 7 is an electrical block diagram of a transconductance amplifier used in the circuit of FIG. 6.

FIG. 7 shows one implementation of transconductance amplifier 211 in greater detail. Amplifier 211 in FIG. 7 is composed of a bipolar differential amplifier with active current loads. Transistors Q1 and Q2, and current sink 266 form the differential amplifier 211, and current sources 268 and 269 form the active loads therefor. The biasing current sources 266, 268 and 269 are normally designed to track each other with the value of current sources 268 and 269 being equal to one-half the value of current source 266. The gain, gm2, of transconductance amplifier 211 can be controlled by adjusting these tracking current sources. The base of transistor Q2 is connected to bias voltage VBIAS. The voltage at the base of transistor Q1 and on capacitor C2 will be approximately equal to VBIAS. Therefore, bias voltage VBIAS can be used to set the node voltage at the second output of phase detector 210.

Figure 8:
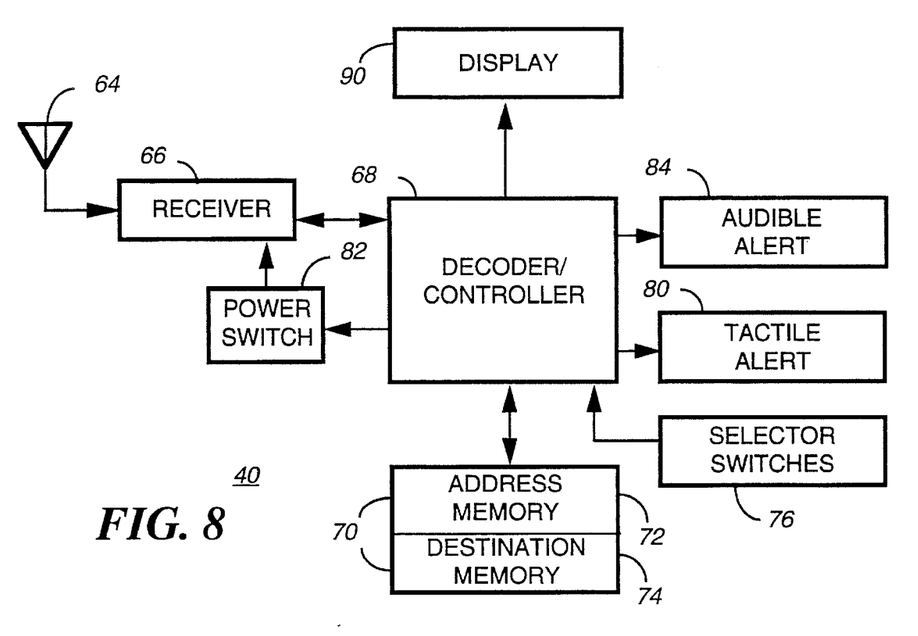
FIG. 8 is art electrical block diagram of a selective call receiver in accordance with the present invention.

Still another example of an application of the inventive phase locked loop circuit is in a selective call receiver, also known as a pager. FIG. 8 shows the components of a selective call receiver 40. The selective call receiver 40 comprises an antenna 64, a receiver circuit 66, a decoder/controller 68, and a code plug memory 70 including an address memory 72 and a destination memory 74. The code plug memory 70 is programmable by a remote programming device, as is well known in the art. In addition, various alert devices are provided, such as the tactile alert 80 and the audible alert 84. A power switch 82 is also provided to activate and de-activate certain components of the selective call receiver 40 under control of the decoder/controller 68. The receiver circuit 66 includes circuitry for demodulating a paging signal, as is well known in the art.

User input into the selective call receiver is by way of selector switches 76. A menu of various user programmable features is accessed via the switches, through the use of menu information displayed on the display 90.

The phase locked loop circuit 200 is, for example, incorporated as a demodulator in the receiver circuit 66, and the frequency synthesized phase locked loop circuit 240 is, for example, incorporated as a local oscillator in the receiver circuit 66, which is, for example, a receiver circuit such as that shown in FIG. 1.

The above description is intended by way of example only and is not intended to limit the present invention in any way except as set forth in the following claims.

What is claimed is:

1. A phase locked loop circuit comprising:

a phase detector having first and second signal inputs, and first and second signal outputs, the first signal input receiving a signal to be processed, the phase detector detecting a phase difference between signals at the first and second signal inputs and generating at the first signal output a first current signal which is proportional to the phase difference between signals at the first and second signal inputs, and at the second signal output a second current signal which is proportional to the first current signal by a constant factor;

a first capacitor connected to the first signal output of the phase detector and generating an output voltage signal;

a first transconductance amplifier coupled to the first capacitor and receiving as input the output voltage signal and generating at an output an output current signal; and a current controlled oscillator having an input coupled to the output of the first transconductance amplifier and to the second signal output of the phase detector and generating at an output an output signal having a frequency which is proportional to a current signal at the input of the current controlled oscillator, the output of the current controlled oscillator being coupled to the second signal input of the phase detector.

2. The phase locked loop circuit of claim 1, wherein the phase detector comprises:

an exclusive-OR gate having first and second signal inputs, and an output, the first signal input being coupled to the signal to be processed, the second signal input being coupled to the output of the current controlled oscillator; and a converter having an input connected to the output of the exclusive-OR gate and having first and second outputs, the first current signal being provided on the first output and the second current signal being provided on the second output.

3. The phase locked loop circuit of claim 1, wherein the second signal output of the phase detector is connected to the output of the first transconductance amplifier to generate an input current signal which is equal to a sum of the second current signal generated by the phase detector and the output current signal of the first transconductance amplifier and which is coupled to the input of the current controlled oscillator.

4. The phase locked loop circuit of claim 1, and further comprising:

a second capacitor having first and second ends, the first end of the second capacitor coupled to the second signal output of the phase detector and the second end of the second capacitor connected to ground; and a second transconductance amplifier having an input coupled to the first end of the second capacitor and an output coupled to the input of the current controlled oscillator.

5. A demodulator comprising the phase locked loop circuit of claim 1, wherein the first signal input of the phase detector is connected to a frequency modulated signal to be demodulated, and the output voltage signal developed across the first capacitor is a recovered audio voltage signal.

6. A receiver circuit comprising the demodulator of claim 5.

7. A selective call receiver comprising the receiver circuit of claim 6.

8. A frequency synthesizer comprising the phase locked loop circuit of claim 1, and further comprising:

a reference oscillator which generates a reference oscillator signal;

a first frequency divider having an input coupled to the reference oscillator and having an output coupled to the first signal input of the phase detector, and for dividing a frequency of the reference oscillator signal by a first magnitude;

a second frequency divider having an input coupled to the output of the current controlled oscillator and an output coupled to the second signal input of the phase detector, and for dividing a frequency of the output signal of the current controlled oscillator by a second magnitude; and wherein the output signal of the current controlled oscillator has a frequency which is dependent on the first and second magnitudes of the first and second frequency dividers.

9. The frequency synthesizer of claim 8, wherein the first and second magnitudes of the first and second frequency dividers are adjustable for controlling the frequency of the output signal of the current controlled oscillator.

10. A selective call receiver comprising the frequency synthesizer of claim 8.

11. A receiver circuit suitable for connection to an antenna for receiving a signal detected by the antenna, the receiver circuit comprising:

an amplifier for amplifying the signal detected by the antenna and generating an amplified signal;

at least one oscillator;

at least one mixer coupled to the at least one oscillator and to an output of the amplifier for mixing the amplified signal to generate a mixed signal; and a demodulator coupled to an output of the at least one mixer, the demodulator comprising:

a phase detector having first and second signal inputs, the first signal input receiving the mixed signal, and the phase detector detecting a phase difference between signals at the first and second signal inputs and generating at first and second outputs first and second current signals, respectively, the first current signal being proportional to the phase difference between signals at the first and second signal inputs, the second current signal being proportional to the first current signal by a constant factor;

a capacitor connected to the first output of the phase detector and generating a recovered audio voltage signal;

a transconductance amplifier connected to the capacitor and receiving as input the recovered audio voltage signal and generating at an output an output current signal; and a current controlled oscillator having an input coupled to the output of the transconductance amplifier and to the second output of the phase detector and generating at an output a signal having a frequency which is proportional to a current signal at the input of the current controlled oscillator, the output of the current controlled oscillator being coupled to the second signal input of the phase detector.

12. A selective call receiver comprising the receiver circuit of claim 11, and further comprising:

a data limiter coupled to the demodulator for receiving the recovered audio voltage signal and for generating a digital signal representative of a selective call signal;

a code plug memory for storing an address of the selective call receiver; and a decoder/controller connected to the data limiter and the code plug memory and responsive to the digital signal to generate an alert based on the digital signal and the address stored in the code plug memory.

13. A phase locked loop circuit comprising:

phase detector means having first and second signal inputs and first and second signal outputs, the first signal input receiving a signal to be processed, the phase detector means detecting a phase difference between signals at the first and second signal inputs and generating at the first signal output a first current signal which is proportional to the phase difference between signals at the first and second signal inputs, and at the second signal output a second current signal which is proportional to the first current signal by a constant factor;

capacitor means connected to the first signal output of the phase detector means and generating an output voltage signal;

transconductance amplifier means coupled to the capacitor means and receiving as input the output voltage signal and generating at an output an output current signal; and current controlled oscillator means having an input coupled to the output of the transconductance amplifier means and to the second signal output of the phase detector means and generating at an output an output signal having a frequency which is proportional to a current signal at the input of the current controlled oscillator means, the output of the current controlled oscillator means being coupled to the second signal input of the phase detector means.

\* \* \* \* \*